(12) United States Patent
Bilski (10) Patent No.: US 6,617,876 B1
(45) Date of Patent: Sep. 9, 2003

(54) STRUCTURES AND METHODS FOR DISTRIBUTING HIGH-FANOUT SIGNALS IN FPGAS USING CARRY MULTIPLEXERS

(75) Inventor: Goran Bilski, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/061,847

(22) Filed: Feb. 1, 2002

(51) Int. Cl.[7] ............................................ H03K 19/177
(52) U.S. Cl. .......................................... 326/41; 326/39
(58) Field of Search ............................... 326/37–41, 47

(56) References Cited

U.S. PATENT DOCUMENTS

| | | | | |
|---|---|---|---|---|
| 5,682,107 A | * | 10/1997 | Tavana et al. ................ | 326/41 |
| 6,118,300 A | * | 9/2000 | Wittig et al. .................. | 326/41 |
| 6,157,209 A | * | 12/2000 | McGettigan ................. | 326/39 |
| 6,353,920 B1 | * | 3/2002 | Wittig et al. .................. | 716/16 |
| 6,427,156 B1 | * | 7/2002 | Chapman et al. ........... | 708/235 |

OTHER PUBLICATIONS

Xilinx, Inc.; "Virtex–II Platform FPGA Handbook"; Copyright 1991–2000; available form Xilinx, Inc., 2100 Logic Drive, San Jose, California 95124; pp. 46–54.

* cited by examiner

Primary Examiner—Michael Tokar
Assistant Examiner—Vibol Tan
(74) Attorney, Agent, or Firm—Lois D. Cartier (57) ABSTRACT

Structures and methods that reduce interconnect resource usage and routing delays in FPGAs by routing high fan-out signals on the CLB carry chains. In a first embodiment, a high fan-out signal distribution structure is implemented in a Field Programmable Gate Array (FPGA). The FPGA includes an array of logic cells, each including a carry multiplexer. The carry multiplexers can be configured to form a carry chain. The carry chain is used to distribute high fan-out signals by passing a high fan-out signal along the chain from carry-in terminal to carry-out terminal, and tapping the signal at the carry-out terminals for distribution to a large number of destinations.

23 Claims, 5 Drawing Sheets

STRUCTURES AND METHODS FOR DISTRIBUTING HIGH-FANOUT SIGNALS IN FPGAS USING CARRY MULTIPLEXERS

FIELD OF THE INVENTION

The invention relates to Field Programmable Gate Arrays (FPGAs). More particularly, the invention relates to structures and methods for distributing high fan-out signals in FPGAs using the carry multiplexers provided in the FPGA configurable logic blocks (CLBs).

BACKGROUND OF THE INVENTION

Programmable logic devices (PLDs) are a well-known type of digital integrated circuit that can be programmed to perform specified logic functions. One type of PLD, the field programmable gate array (FPGA), typically includes an array of configurable logic blocks (CLBs) surrounded by a ring of programmable input/output blocks (IOBs). The CLBs and IOBs are interconnected by a programmable interconnect structure. Some FPGAs also include additional logic blocks with special purposes (e.g., DLLs, RAM, and so forth). CLBs typically include several logic cells, each including (for example) a function generator, a memory element such as a flip-flop or latch, and associated supporting logic.

The CLBs, IOBs, interconnect, and other logic blocks are typically programmed by loading a stream of configuration data (bitstream) into internal configuration memory cells that define how the CLBs, IOBs, and interconnect are configured. The configuration data may be read from memory (e.g., an external PROM) or written into the FPGA by an external device. The collective states of the individual memory cells then determine the function of the FPGA.

Routing resources (i.e., the programmable interconnect structure) can be a limiting factor in implementing user circuits in FPGAs. In other words, not only must the user logic elements fit into the available function generators and memory elements of the FPGA, but there must also be sufficient routing resources to properly interconnect these logic elements. The signals that use the most routing resources are typically those with the highest fan-out, that is, the signals with the largest number of destinations. Therefore, it is desirable to provide structures and methods that reduce the number of high fan-out signals distributed using the programmable interconnect structure in FPGAs.

The speed of interconnection paths between logic elements is often critical, as well. Routing delays often determine the maximum operating speed of a circuit, particularly the routing delays of the high fan-out signals. Therefore, it is also desirable to provide structures and methods that reduce the routing delays of high fan-out signals implemented in FPGAs.

SUMMARY OF THE INVENTION

The invention provides structures and methods that reduce interconnect resource usage and can reduce routing delays in FPGAs by routing high fan-out signals on the CLB carry chains.

A first embodiment of the invention provides a high fan-out signal distribution structure implemented in a Field Programmable Gate Array (FPGA). The FPGA includes an array of logic cells, each including a carry multiplexer. The carry multiplexers can be configured to form a carry chain. The carry chain logic is included in the FPGA in order to facilitate the implementation of multi-bit logic such as addition and subtraction. However, as described herein, the carry chain can also be used to distribute high fan-out signals by passing a high fan-out signal along the chain from carry-in terminal to carry-out terminal of each carry multiplexer, and tapping the signal at the carry-out terminals for distribution to a large number of destinations.

The advantages of this signal distribution structure include resource efficiency and routing speed. With regard to resource efficiency, the use of FPGA resources is minimized. Not only are function generators no longer needed to buffer the signal, but use of the general interconnect structure is also reduced. With regard to routing speed, passing the signal through the carry multiplexers is generally faster than the current practice of buffering the signal in function generators.

A second embodiment of the invention provides methods for distributing a high fan-out signal in an FPGA. The FPGA includes logic cells and an interconnect structure interconnecting the logic cells. The high fan-out signal is routed by configuring a series of logic cells to pass the high fan-out signal through carry multiplexers in a series of logic cells. The interconnect structure is configured to tap the carry-out signals from the carry multiplexers and distribute the carry-out signals to the various destinations.

As in the first embodiment, in this embodiment the carry multiplexers are simultaneously distributing the high fan-out signal and buffering the signal, without using any function generators and while reducing the use of the interconnect structure.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

In the following description, numerous specific details are set forth to provide a more thorough understanding of the present invention. However, it will be apparent to one skilled in the art that the present invention may be practiced without these specific details.

Figure 1:
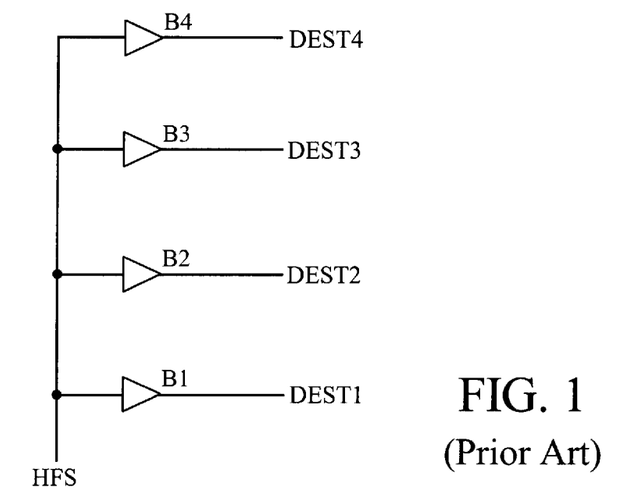
FIG. 1 shows a well-known structure for distributing a high fan-out signal.

FIG. 1 shows a well known circuit used to distribute high fan-out signals. A high fan-out signal HFS is divided into several different signals, and each signal is separately buffered. (In the present specification, the same reference characters are used to refer to terminals, signal lines, and their corresponding signals.) In the pictured signal distribution structure, four buffers B1–B4 are used. The destinations (i.e., the logic gates driven by the high fan-out signal) are divided into four destination groups labeled DEST1–DEST4, respectively. Each destination group can contain many logic gates to be driven by high fan-out signal HFS.

The number of buffers is selected based on several factors, including the number of signal destinations (i.e., the fan-out of signal HFS), the capacitance of each destination, the distance between the source signal and the destination, the operating temperature,-the required rise and fall times on the high fan-out signal, and so forth. The number and distribution of buffers is often derived based on simulation results that forecast the resulting speed of the HFS signal based on these and other factors. This derivation process is well-known in the art of integrated circuit design. For FPGAs, timing delay estimation software is generally available from the associated FPGA provider.

Figure 2:
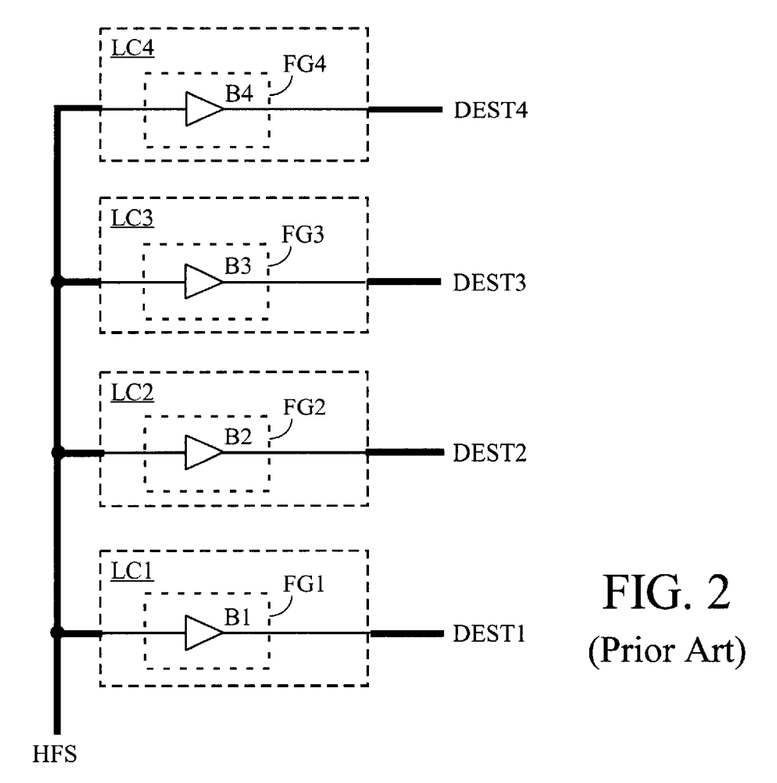
FIG. 2 shows how the structure of FIG. 1 is typically implemented in an FPGA.

FIG. 2 shows a common structure for implementing the signal distribution circuit of FIG. 1 in an FPGA. Each buffer is implemented using a function generator (FG1–FG4). In this example, each FPGA logic cell comprises one function generator (often implemented as a 4-input lookup table) and one memory cell optionally driven by the function generator output, with additional supporting logic. Therefore, the implementation of FIG. 2 uses four FPGA logic cells.

In some FPGAs the function generator and the memory cell can be used for separate functions. Therefore, in some FPGAs the implementation of FIG. 2 leaves the memory cells available for other uses. In other FPGAs, the entire logic cell is consumed by implementing this simple buffering function.

Additionally, a function generator typically has a significant built-in delay. The function generator is a very flexible structure, typically implemented as a 4-input lookup table comprising an array of memory cells. Therefore, the delay through a function generator can be undesirably large when implementing a simple function such as a buffer. For example, the delay through a function generator is typically longer than the delay through a simple logic gate such as an inverter, a NAND gate, a NOR gate, or a multiplexer.

Note that in FIG. 2 some portions of the signal lines HFS and DEST1–DEST4 are shown using a heavy line. These portions of the structure are implemented using the FPGA interconnect structure. As can be seen from the figure, in this implementation the FPGA interconnect structure is used to route the high fan-out signal both vertically and horizontally.

The Virtex-II FPGA logic cell has been selected to demonstrate the present invention. However, many other FPGA logic cells can also be used. As will be seen, the only elements necessary to implement the present invention in an FPGA logic cell are the carry multiplexer and a means for tapping the carry multiplexer carry-out signal.

Figure 3:
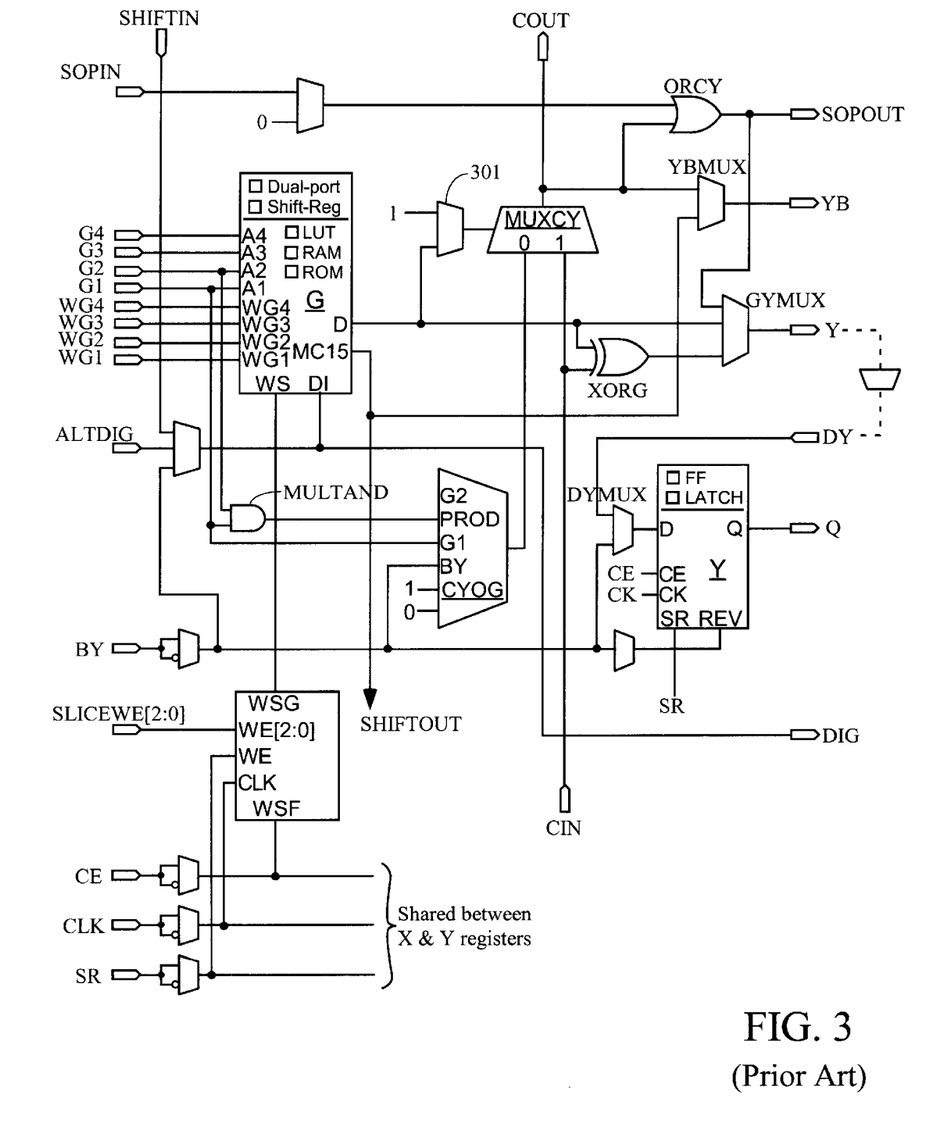
FIG. 3 is a simplified diagram of a logic cell in an exemplary FPGA, the Virtex™-II FPGA from Xilinx, Inc.

FIG. 3 shows a logic cell for the Virtex-II FPGA. The drawing in FIG. 3 is based on FIG. 15 from page 47 of the "Virtex™-II Platform FPGA Handbook", published in December of 2000 and available from Xilinx, Inc. Pages 46–54 of this document, which describe the Configurable Logic Block (CLB) of the Virtex-II FPGA, are incorporated herein by reference.

The Virtex-II logic cell includes a function generator G that can be configured, among other options, as a 4-input look-up table (LUT). When configured as a 4-input look-up table, up to four data input signals G1–G4 are accepted and a function generator output signal is provided. The output signal can be any function of the four input signals. Note that this function generator could be used to implement one of the buffers B1–B4 shown in FIG. 2.

Carry multiplexer MUXCY is controlled by multiplexer 301, which in turn is controlled by the contents of a configuration memory cell (not shown). Multiplexer 301 optionally passes the "1" signal to the select terminal of carry multiplexer MUXCY, in which case carry multiplexer MUXCY passes the carry-in signal from the CIN terminal to the carry-out terminal COUT. Alternatively, multiplexer 301 passes the output signal from function generator G to the select terminal of carry multiplexer MUXCY, in which case carry multiplexer MUXCY passes the output signal from multiplexer CYOG to the carry-out terminal COUT. Thus, the output of carry multiplexer MUXCY is passed to another logic cell.

The output signal from carry multiplexer MUXCY can optionally be provided, through multiplexer YBMUX, to output terminal YB of the logic cell. Alternatively, the output signal from carry multiplexer MUXCY can be provided, through OR gate ORCY, to output terminal SOPOUT of the logic cell.

Other elements shown in FIG. 3 are not relevant to the present specification. Information on these elements can be obtained from the aforementioned FPGA handbook.

Figure 4:
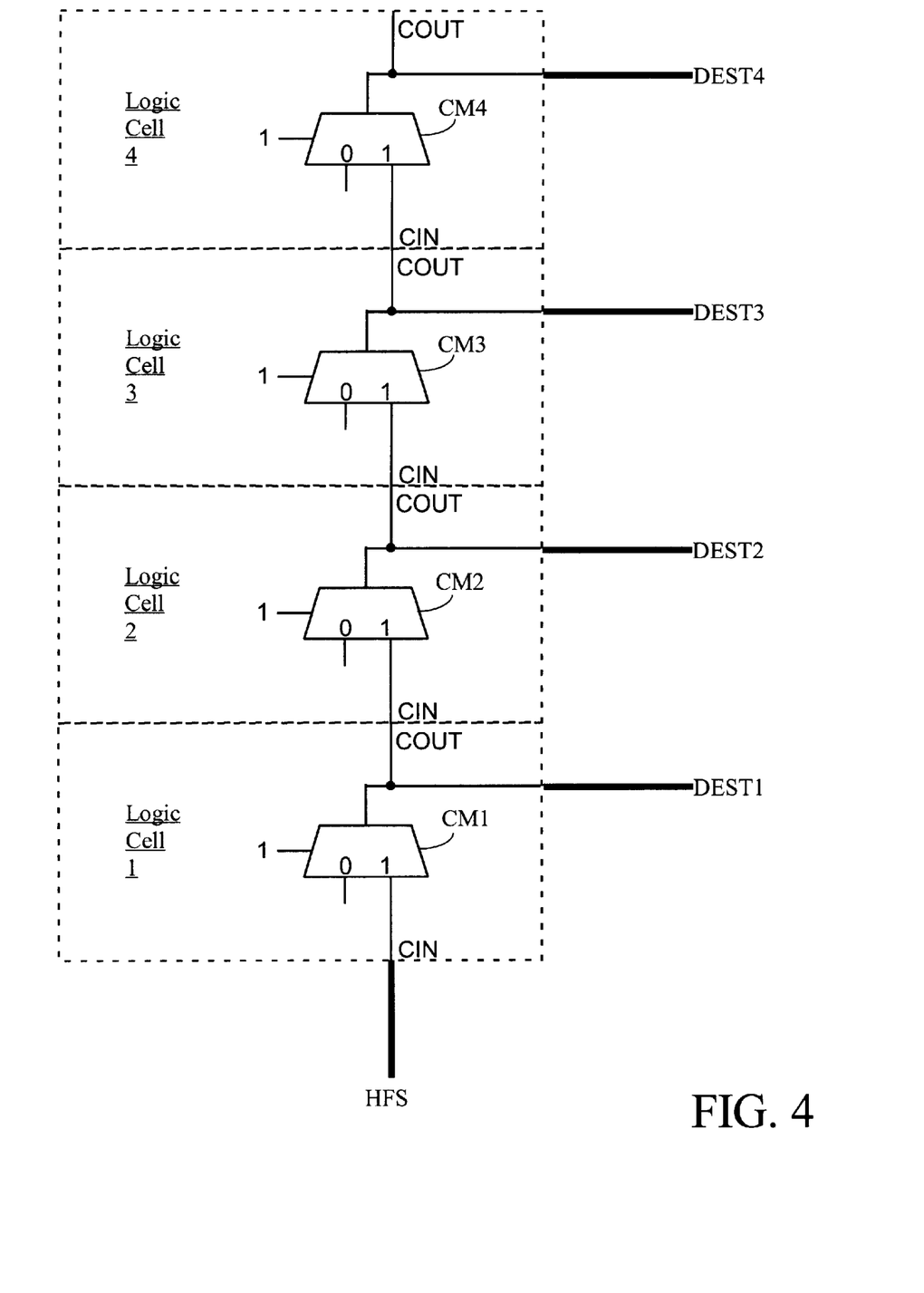
FIG. 4 shows one implementation of a high fan-out signal distribution structure that uses the carry multiplexers in a series of FPGA logic cells.

FIG. 4 shows a high fan-out signal distribution structure designed according to the invention for implementation in a series of FPGA logic cells. This embodiment includes four logic cells, but any number of logic cells can be used. The number of logic cells is limited by considerations similar to those affecting the structure of FIG. 1, and is determined using similar well-known techniques such as simulations and the timing delay software available from FPGA providers.

In the exemplary structure shown in FIG. 4, the high fan-out input signal HFS is provided to the carry-in terminal CIN of a first logic cell (Logic Cell 1). Carry-in cl terminal CIN is coupled, using dedicated logic hard-wired in the FPGA, to the "1" data input terminal of the carry multiplexer CM1. Carry multiplexer CM1 is configured to pass the input signal from the "1" data terminal to the output terminal of the carry multiplexer. The output terminal of the carry multiplexer is in turn hard-wired to the carry-out terminal COUT of the logic cell.

In FPGAs, the path from the CIN terminal to the COUT terminal of the logic cell is carefully designed to be as fast as is reasonably possible. The specification for delay on this path is always tight, because the speed of the carry chain often determines the final operating speed of circuits performing multi-bit arithmetic operations. Therefore, the path from the CIN terminal to the COUT terminal is typically much faster, for example, than the path through the function generator. Hence, the signal distribution structure of FIG. 4 is faster than the signal distribution structure shown in FIG. 2.

Of course, if a sufficient number of carry multiplexers are connected in series, the sum of the delays becomes larger than a single function generator delay. However, for sufficiently small distribution structures, the implementation of FIG. 4 is preferable to the implementation of FIG. 2. The maximum number of carry multiplexers that results in a reduced distribution delay varies for different FPGAs, but is easily determined by one of ordinary skill using simulations and FPGA timing delay software.

FIG. 4 shows some of the signal lines drawn with heavier lines than others, as did FIG. 2. As in FIG. 2, the heavier lines denote signal lines implemented using the programmable interconnect structure of the FPGA. Note that there are fewer heavy lines in FIG. 4, because the vertical distribution of the high fan-out signal is accomplished using the carry chain. Therefore, this implementation uses the FPGA routing resources more efficiently than the implementation of FIG. 2.

Figure 5:
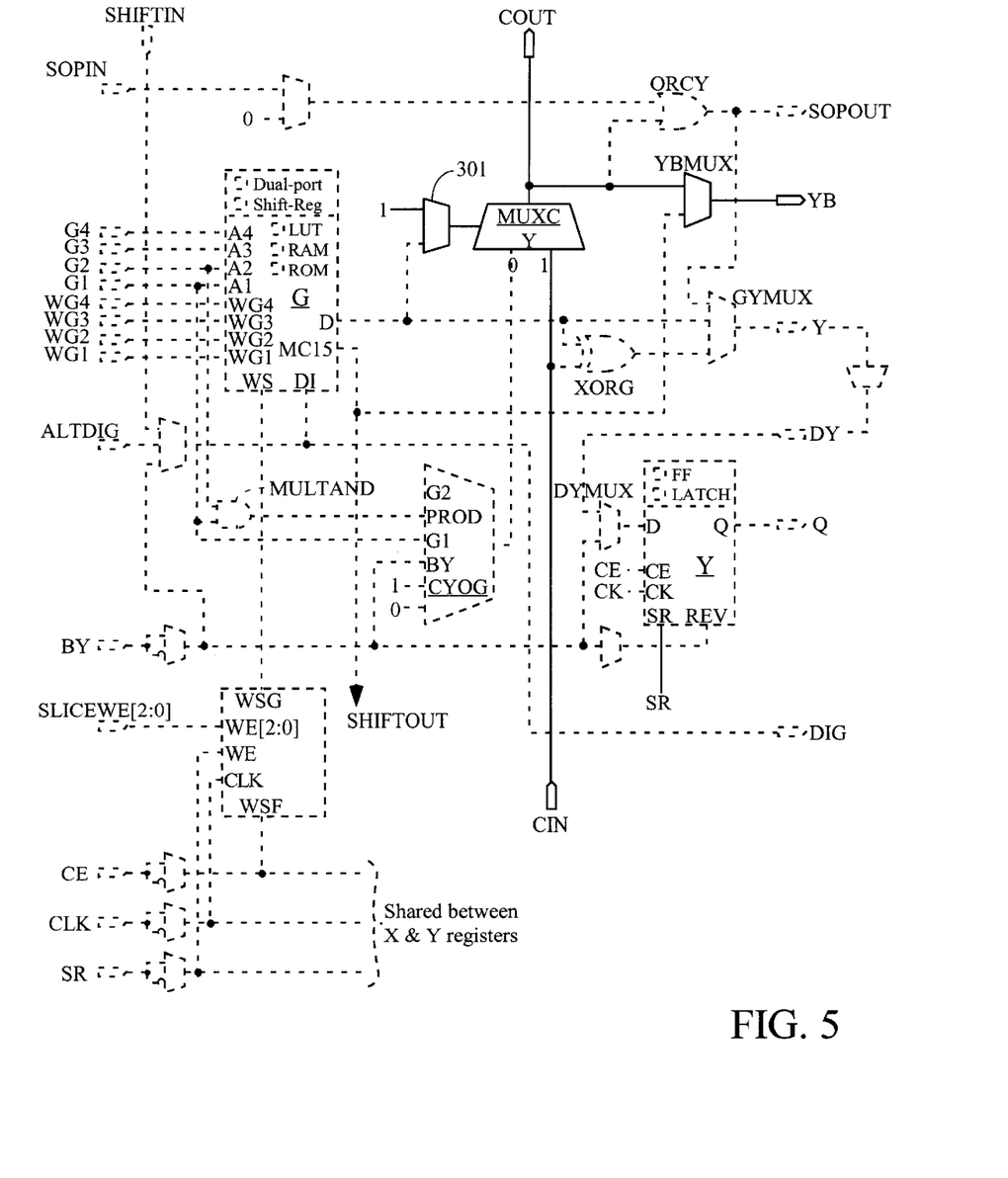
FIG. 5 shows the elements of the Virtex-II logic cell that are used in the implementation of FIG. 4.

FIG. 5 shows one way in which the signal distribution structure of FIG. 4 can be implemented in the Virtex-II logic cell shown in FIG. 3. Carry multiplexer MUXCY is used to implement carry multiplexers CM1–CM4 of FIG. 4. Programmable multiplexer 301 is used to select a "1" value for carry multiplexer MUXCY, selecting the carry-in input signal CIN to be placed on the carry-out output terminal COUT. In this embodiment, multiplexer YBMUX is used to place the carry-out signal onto output terminal YB of the logic cell.

Dotted elements in FIG. 5 are not used to form the signal distribution structure, and are available for other uses. Notice that most of the logic cell is still available, including the function generator G and the memory element Y, with large amounts of supporting logic. Therefore, this implementation also uses the logic cell resources more efficiently than the implementation of FIG. 2.

In another embodiment (not shown), the carry multiplexer output signal is routed through the OR gate ORCY, and hence onto the SOPOUT terminal (see FIG. 5).

There is also another advantage of the invention, when applied (for example) to the Virtex-II architecture. Function generator output signals are generally routed through the Y output terminal (see FIG. 5) and hence through an output multiplexer (not shown in FIG. 5). This output multiplexer has an inherent delay. By using the carry multiplexer instead of the function generator to route the high fan-out signal, the output multiplexer is bypassed, further reducing delay on the distributed signal.

Figure 6:
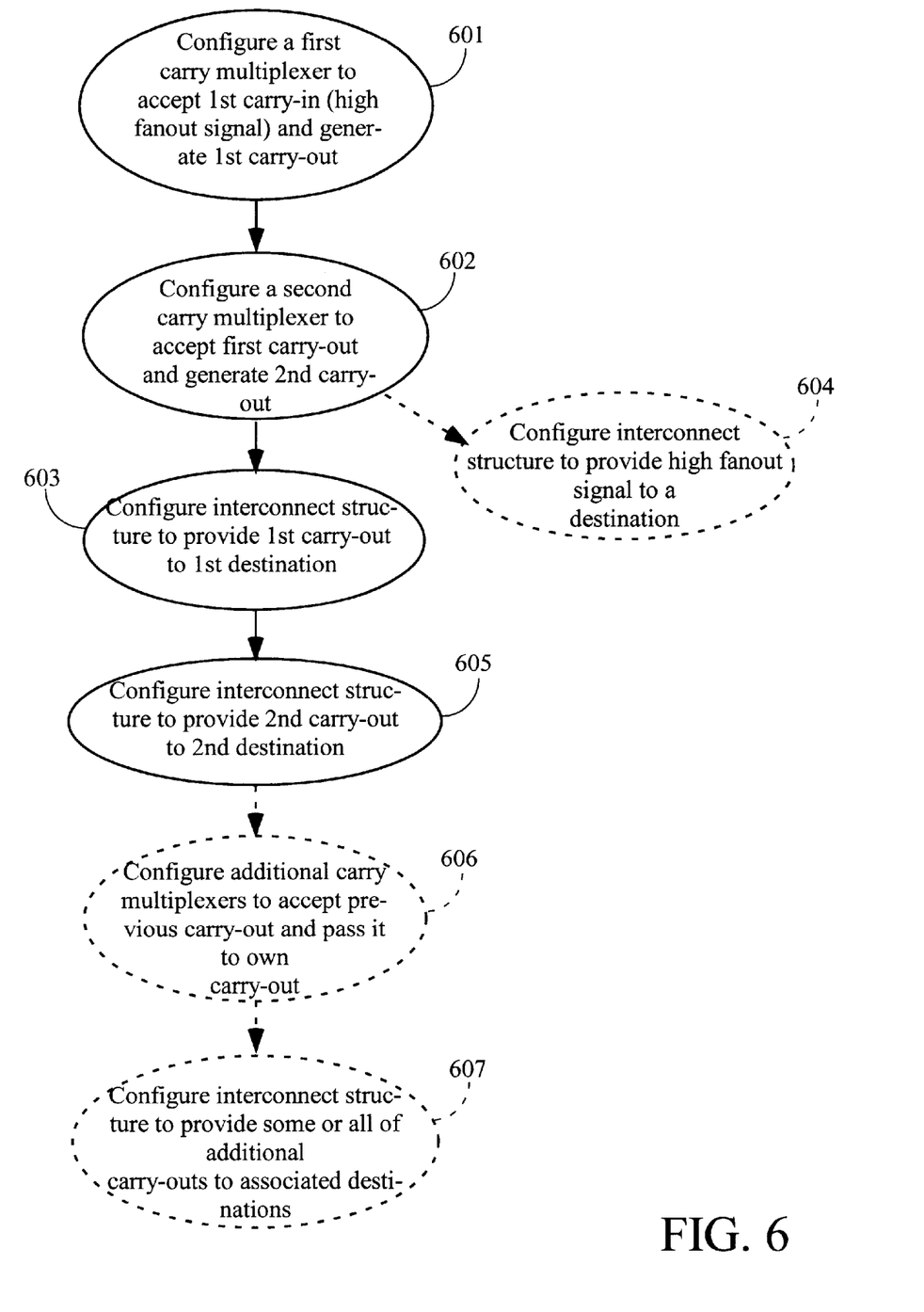
FIG. 6 is a flow chart illustrating a method for distributing a high fan-out signal using the carry multiplexers in a series of FPGA logic cells.

FIG. 6 shows a process that can be followed to implement a high fan-out signal distribution system in an FPGA. The steps of this process can be implemented in any order. In many FPGAs, the steps are all accomplished by loading a single configuration data file (bitstream) to the FPGA. Therefore, the steps are essentially simultaneous. Optional steps are shown using dashed lines.

In step 601, a first carry multiplexer in a first logic cell is configured to accept a first carry-in signal (the high fan-out signal) and pass the carry-in signal to a carry-out terminal as a first carry-out signal. In step 602, a second carry multiplexer in a second logic cell is configured to accept the carry-out signal from the first carry multiplexer at a carry-in terminal, and to pass the accepted signal to a carry-out terminal as a second carry-out signal.

In step 603, the interconnect structure of the FPGA is configured to provide the first carry-out signal to a first destination. In optional step 604, the interconnect structure of the FPGA is configured to provide the high fan-out signal to another destination. This interconnection simply uses the high fan-out signal to drive a portion of the destination loads, as well as driving the first carry multiplexer in the multiplexer chain. In step 605, the interconnect structure of the FPGA is configured to provide the second carry-out signal to a first destination.

Steps 606 and 607 are also optional. In step 606, additional multiplexers are configured in a fashion similar to the first and second multiplexers, thereby providing additional carry-out signals. In step 607, the interconnect structure of the FPGA is configured to deliver each of these additional carry-out signals to their associated destinations.

The methods of the present invention may be performed in either hardware, software, or any combination thereof, as those terms are currently known in the art. In particular, the present method may be carried out by software, firmware, or microcode operating on a computer or computers of any type. Additionally, software embodying the present invention may comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Furthermore, such software may also be in the form of a computer data signal embodied in a carrier wave, such as that found within the well-known Web pages transferred among computers connected to the Internet. Accordingly, the present invention is not limited to any particular platform.

Those having skill in the relevant arts of the invention will now perceive various modifications and additions that may be made as a result of the disclosure herein. For example, the above text describes the circuits and methods of the invention in the context of Field Programmable Gate Arrays (FPGAs) such as the Virtex-II FPGAs from Xilinx, Inc. However, the invention can also be applied to other Programmable Logic Devices (PLDs) and other FPGAs.

Further, FPGAs, logic cells, function generators, look-up tables, multiplexers, carry multiplexers, and buffers other than those described herein can be used to implement the invention. Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art. Accordingly, all such modifications and additions are deemed to be within the scope of the invention, which is to be limited only by the appended claims and their equivalents.

What is claimed is:

1. A high fan-out signal distribution structure implemented in a Field Programmable Gate Array (FPGA), the FPGA comprising a plurality of carry multiplexers in associated logic cells and an interconnect structure interconnecting the logic cells, the structure comprising:

a high fan-out input terminal;

a first carry multiplexer in a first logic cell, the first carry multiplexer having a carry-out terminal, a carry-in terminal coupled to the high fan-out input terminal, and a select terminal selecting a signal on the carry-in terminal for placement on the carry-out terminal;

a second carry multiplexer in a second logic cell, the second carry multiplexer having a carry-out terminal, a carry-in terminal coupled to the carry-out terminal of the first carry multiplexer, and a select terminal selecting a signal on the carry-in terminal for placement on the carry-out terminal;

a first portion of the interconnect structure coupled between the carry-out terminal of the first carry multiplexer and at least a first destination and completing an interconnection therebetween; and a second portion of the interconnect structure coupled between the carry-out terminal of the second carry multiplexer and at least a second destination and completing an interconnection therebetween.

2. The high fan-out signal distribution structure of claim 1, further comprising:

another portion of the interconnect structure coupled between the high fan-out input terminal and at least one destination and completing an interconnection therebetween.

3. The high fan-out signal distribution structure of claim 1, wherein:
- the carry-in terminal of the first carry multiplexer is the "1" terminal; and
- the select terminal of the first carry multiplexer provides a "1" value, thereby selecting the signal on the carry-in terminal of the first carry multiplexer for placement on the carry-out terminal of the first carry multiplexer.

4. The high fan-out signal distribution structure of claim 3, wherein the "1" value is provided by a high value stored in a configuration memory cell of the FPGA.

5. The high fan-out signal distribution structure of claim 1, further comprising:
- a third carry multiplexer in a third logic cell, the third carry multiplexer having a carry-out terminal, a carry-in terminal coupled to the carry-out terminal of the second carry multiplexer, and a select terminal selecting a signal on the carry-in terminal for placement on the carry-out terminal; and
- a third portion of the interconnect structure coupled between the carry-out terminal of the third carry multiplexer and at least a third destination and completing an interconnection therebetween.

6. The high fan-out signal distribution structure of claim 1, further comprising:
- additional carry multiplexers in additional logic cells, each additional carry multiplexer having a carry-out terminal, a carry-in terminal coupled to the carry-out terminal of a previous carry multiplexer, and a select terminal selecting a signal on the carry-in terminal for placement on the carry-out terminal; and
- additional portions of the interconnect structure coupled between the carry-out terminals of the additional carry multiplexers and additional associated destinations and completing interconnections therebetween,
- wherein at least one of the additional carry multiplexers has no associated additional portion of the interconnect structure and no associated destination.

7. The high fan-out signal distribution structure of claim 1, wherein the first and second carry multiplexers and the interconnect structure are configurable circuits configured by storing configuration data into associated memory cells of the FPGA.

8. A method for distributing a high fan-out signal in a Field Programmable Gate Array (FPGA) comprising logic cells and an interconnect structure interconnecting the logic cells, the method comprising:
- configuring a first carry multiplexer in a first logic cell to accept the high fan-out signal and to pass the high fan-out signal to a first carry multiplexer output terminal as a first carry-out signal;
- configuring a second carry multiplexer in a second logic cell to accept the first carry-out signal and to pass the accepted signal to a second carry multiplexer output terminal as a second carry-out signal;
- configuring the interconnect structure to pass the first carry-out signal to at least a first destination; and
- configuring the interconnect structure to pass the second carry-out signal to at least a second destination.

9. The method of claim 8, further comprising:
- configuring the interconnect structure to pass the high fan-out input signal to at least one another destination.

10. The method of claim 8, further comprising providing the high fan-out signal on a carry-in terminal of the first carry multiplexer, and wherein configuring the first carry multiplexer comprises configuring the first carry multiplexer to pass a signal on the carry-in terminal to the first carry multiplexer carry-out terminal.

11. The method of claim 8, wherein configuring the first carry multiplexer comprises storing a value in a configuration memory cell of the FPGA.

12. The method of claim 8, further comprising:
- configuring a third carry multiplexer in a third logic cell to accept the second carry-out signal and to pass the accepted signal to a third carry multiplexer output terminal as a third carry-out signal; and
- configuring the interconnect structure to pass the third carry-out signal to at least a third destination.

13. The method of claim 8, further comprising:
- configuring additional carry multiplexers in additional logic cells each to accept a carry-out signal from a previous carry multiplexer and to pass the accepted signal to an associated carry multiplexer output terminal as additional carry-out signals; and
- configuring the interconnect structure to pass only some of the additional carry-out signals to associated destinations.

14. The method of claim 8, wherein configuring a first carry multiplexer, configuring a second carry multiplexer, configuring the interconnect structure to pass the first carry-out signal, and configuring the interconnect structure to pass the second carry-out signal comprise writing configuration data to configuration memory cells in the FPGA.

15. The method of claim 8, wherein configuring a first carry multiplexer, configuring a second carry multiplexer, configuring the interconnect structure to pass the first carry-out signal, and configuring the interconnect structure to pass the second carry-out signal are performed simultaneously.

16. The method of claim 8, wherein configuring a first carry multiplexer, configuring a second carry multiplexer, configuring the interconnect structure to pass the first carry-out signal, and configuring the interconnect structure to pass the second carry-out signal are performed in the stated order.

17. A high fan-out signal distribution structure implemented in a Field Programmable Gate Array (FPGA), the FPGA comprising a plurality of carry multiplexers in associated logic cells and an interconnect structure interconnecting the logic cells, the structure comprising:
- means for configuring a first carry multiplexer in a first logic cell to accept a high fan-out signal and to pass the high fan-out signal to a first carry multiplexer output terminal as a first carry-out signal;
- means for configuring a second carry multiplexer in a second logic cell to accept the first carry-out signal and to pass the accepted signal to a second carry multiplexer output terminal as a second carry-out signal;
- means for configuring the interconnect structure to pass the first carry-out signal to at least a first destination; and
- means for configuring the interconnect structure to pass the second carry-out signal to at least a second destination.

18. The high fan-out signal distribution structure of claim 17, further comprising:
- means for configuring a third carry multiplexer in a third logic cell to accept the second carry-out signal and to pass the accepted signal to a third carry multiplexer output terminal as a third carry-out signal; and
- means for configuring the interconnect structure to pass the third carry-out signal to at least a third destination.

19. A computer storage device comprising configuration data to configure a Field Programmable Gate Array (FPGA) comprising logic cells and an interconnect structure interconnecting the logic cell, the configuration data comprising:

a first set of the configuration data that configures a first carry multiplexer in a first logic cell to accept the high fan-out signal and to pass the high fan-out signal to a first carry multiplexer output terminal as a first carry-out signal;

a second set of the configuration data that configures a second carry multiplexer in a second logic cell to accept the first carry-out signal and to pass the accepted signal to a second carry multiplexer output terminal as a second carry-out signal;

a third set of the configuration data that configures the interconnect structure to pass the first carry-out signal to at least a first destination; and a fourth set of the configuration data that configures the interconnect structure to pass the second carry-out signal to at least a second destination.

20. The computer storage device of claim 19, further comprising:

a fifth set of the configuration data that configures a third carry multiplexer in a third logic cell to accept the second carry-out signal and to pass the accepted signal to a third carry multiplexer output terminal as a third carry-out signal; and a sixth set of the configuration data that configures the interconnect structure to pass the third carry-out signal to at least a third destination.

21. The computer storage device of claim 19, wherein the first, second, third, and fourth sets of the configuration data are included in a single computer file.

22. The computer storage device of claim 21, wherein the single computer file comprises an FPGA bitstream.

23. The computer storage device of claim 21, wherein the first, second, third, and fourth sets of the configuration data are interleaved in the single computer file.

* * * * *